(12) United States Patent
Pang et al.

(10) Patent No.: US 6,502,231 B1
(45) Date of Patent: Dec. 31, 2002

(54) INTEGRATED CIRCUIT TEMPLATE CELL SYSTEM AND METHOD

(75) Inventors: Simon S. Pang, San Diego, CA (US); Rimon Shookhtim, Cardiff by the Sea, CA (US); Joseph J. Balardeta, Carlsbad, CA (US); Gary Wong, San Diego, CA (US)

(73) Assignee: Applied Micro Circuits Corporation, San Diego, CA (US)

( * ) Notice: Subject to any disclaimer, the term of this patent is extended or adjusted under 35 U.S.C. 154(b) by 0 days.

(21) Appl. No.: 09/871,473

(22) Filed: May 31, 2001

(51) Int. Cl.$^7$ .......................... G06F 17/50; H03K 19/00
(52) U.S. Cl. ........................................... 716/17; 716/14
(58) Field of Search ....................... 716/17, 14; 257/723

(56) References Cited

U.S. PATENT DOCUMENTS

| | | | |
|---|---|---|---|
| 4,811,237 A | * 3/1989 | Putatunda et al. | 716/9 |
| 4,951,221 A | * 8/1990 | Corbett et al. | 703/15 |
| 5,095,352 A | * 3/1992 | Noda et al. | 257/202 |
| 5,225,720 A | * 7/1993 | Kondoh et al. | 326/21 |
| 5,291,062 A | 3/1994 | Higgins, III | 257/698 |
| 5,313,079 A | * 5/1994 | Brasen et al. | 257/206 |
| 5,541,449 A | 7/1996 | Crane, Jr. et al. | 257/697 |
| 5,844,317 A | 12/1998 | Bertolet et al. | 257/773 |
| 5,892,179 A | 4/1999 | Rinne et al. | 174/261 |
| 6,075,290 A | 7/2000 | Schaefer et al. | 257/737 |
| 6,168,969 B1 | 1/2001 | Farnworth | 438/106 |
| 6,209,123 B1 | 3/2001 | Maziasz et al. | 716/14 |

* cited by examiner

Primary Examiner—David Nelms
Assistant Examiner—Tu-Tu Ho
(74) Attorney, Agent, or Firm—Gray Cary Ware & Freidenrich; Terrance A. Meador

(57) ABSTRACT

A system and method are provided for forming a template cell on the input/output (I/O) surface of an integrated circuit (IC). The first metal layer of the cell includes a plurality of parallel bus lines extending from one edge of the cell to the other. A second underlying metal layer includes bus lines extending in an orthogonal direction to the first layer lines. A signal routing layer underlies the second metal layer, with a routing channel located around the edges of the cell, and ESD and output buffer circuits placed inside of the routing channel. The bus lines of the first and second metal layers, and the routing channel of the signal routing layer, have connection areas so that connections are formed by abutting the cells. Each cell also includes a flip-chip solder pad overlying the first metal layer that can be connected by a via to either the first or second metal layer.

32 Claims, 10 Drawing Sheets

Vertical LM bussing connected to power supply. (310)

Horizontal LM bussing connected to power supply. (304)

VIA connections

| | Vertical LM bussing connected to power supply. (310) |
|---|---|
|  | Horizontal LM bussing connected to power supply. (304) |
|  | VIA connections | ic

INTEGRATED CIRCUIT TEMPLATE CELL SYSTEM AND METHOD

FIELD OF THE INVENTION

The invention relates to integrated circuit cell architecture and, more particularly, to a system and method for forming templates for input/output (I/O) cells and power cells to improve cell interconnections.

BACKGROUND OF THE INVENTION

As the speed and the number of I/Os of integrated circuits increases, more designs are migrating to the flip-chip technologies, such as the controlled collapse chip connection (C4) technology. The layout design of power and I/O cells are critical in order to have a floor plan with low power bus drop to each cell, low noise to sensitive analog blocks without compromising the size of the chip, and ease for place and route.

Flip-chip bumps, e.g., C4 bumps, are typically placed at the boundary of the chip. In accordance with conventional design layout techniques, prior art I/O buffer transistors are usually placed a significant distance from the C4 bump IC interface. This distance, and the relatively long wire routes, permit the introduction of parasitics in the interface, and the degradation of the intended signals.

It would be advantageous if a cell template could be designed for I/O cells.

It would be advantageous if the bus connections between I/O cells could be standardized to minimize design and layout time.

It would be advantageous if a standard cell template could be designed to minimize the line trace lengths, and therefore the noise, associated with I/O cell buffer transistors.

SUMMARY OF THE INVENTION

Accordingly, a system is provided for forming integrated circuit (IC) interconnections. The system comprises an IC input/output (I/O) surface and a plurality of abutted (interconnected) template cells on the IC I/O surface. Each template cell comprises a first metal layer for busing power, a second metal layer, underlying the first metal layer, for busing power, and a signal routing layer underlying the second metal layer, having a routing channel adjacent to the sides of the cell. In accordance with one aspect of the present invention, an I/O buffer transistor can be grouped with a flip-chip bump and a corresponding contact pad. This grouping simplifies the layout and reduces the physical separation between the I/O. buffer transistor and the flip-chip bump.

The first metal layer includes a plurality of parallel bus lines extending from a first side to the rectangular template to an opposite second side. The second metal layer also includes a plurality of parallel bus lines extending from a third side to an opposite fourth side of the template cell. The first and second layer bus lines have connection areas for connection to bus lines in abutting template cells. The routing channel includes a plurality of signal trace lines with connection areas that, likewise, connect to the signal trace lines in abutting template cells.

The cell also includes an I/O connection pad overlying the first metal layer for receiving a solder ball or bump, such as a C4 bump. Each template cell further includes either a via, or a connection trace via combination to connect the pad to either the first or second metal layer bus lines.

For power cells, the flip-chip bumps are connected to a power bus line formed in one of the metal layers. For I/O signal cells, the flip-chip bumps are connected to I/O buffer transistors.

Additional details of the above-mentioned system and a method for forming an IC I/O cell template are discussed in greater detail below.

DETAILED DESCRIPTION OF THE PREFERRED EMBODIMENTS

Figure 1:
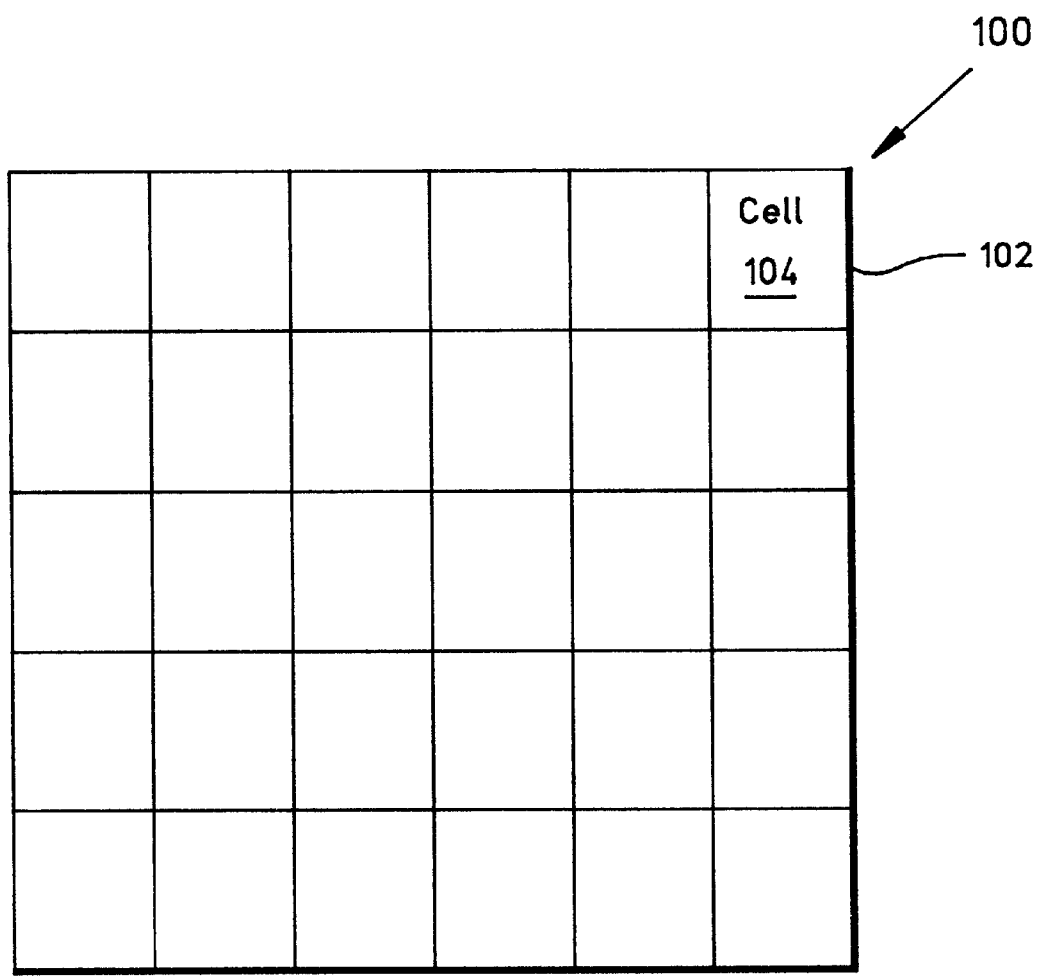
FIG. 1 is a plan view of the present invention integrated circuit (IC) interconnection system.

FIG. 1 is a plan view of an integrated circuit (IC) interconnection system according to the present invention. The system 100 comprises an IC input/output (I/O) surface 102 and a plurality of abutting and interconnected template cells, such as template cell 104, on the IC I/O surface 102.

Figure 2:
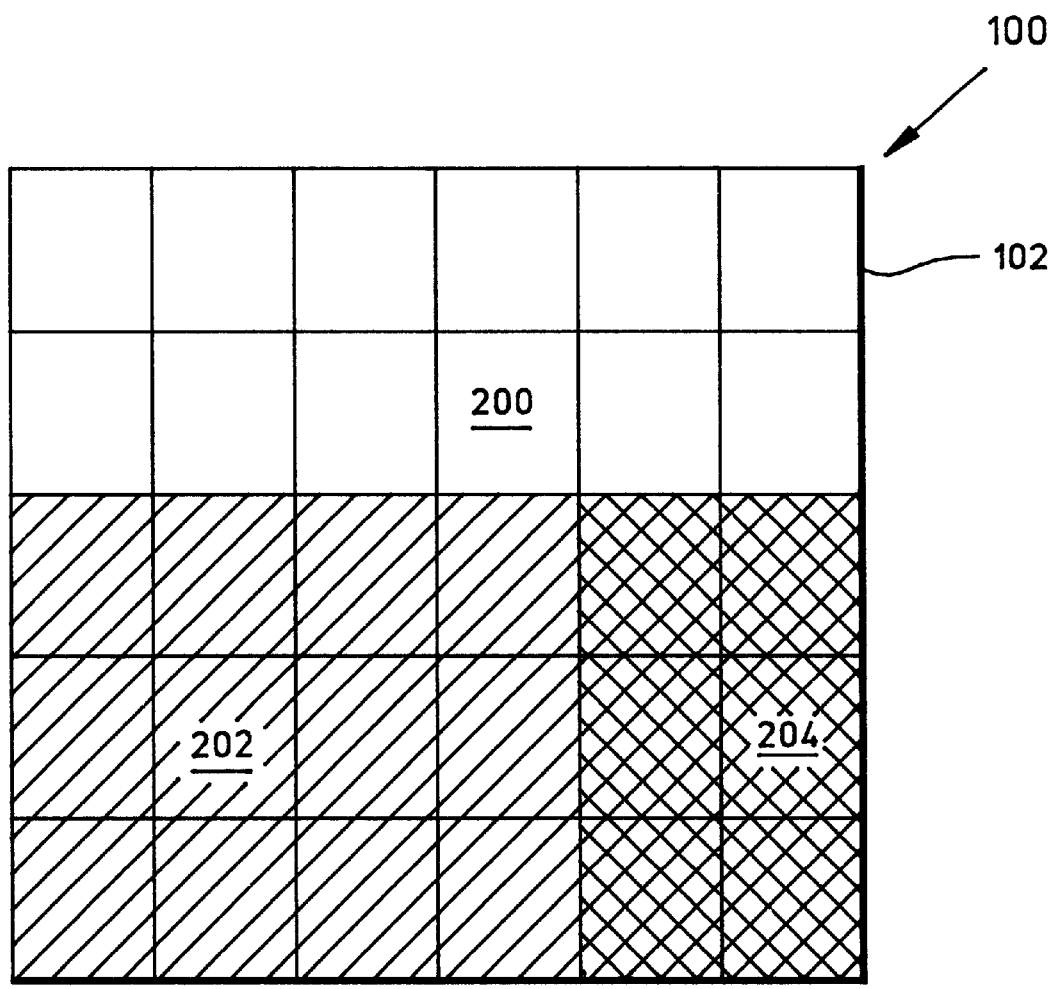
FIG. 2 is partially sectioned view of the IC surface of FIG. 1.

FIG. 2 is partially sectioned view of the IC surface of FIG. 1. Each template cell 104 comprises a first metal layer 200 for busing power and a second metal layer 202, underlying the first metal layer 200, for busing power. The first metal layer 200 is represented as unmarked and the second metal layer 202 is represented by cross-hatched lines. A signal routing layer 204 underlies the second metal layer 202, and is represented with double cross-hatched lines. FIG. 2 shows signal routing layer 204 as though a portion of the first metal layer 200 and a portion of the second metal layer 202 have been removed or peeled away. Similarly, FIG. 2 shows second metal layer 202 as though a portion of the first metal layer 200 has been removed. Thus, portions of the second metal layer 202 and the signal routing layer 204 are hidden from view in FIG. 2.

Figure 3:
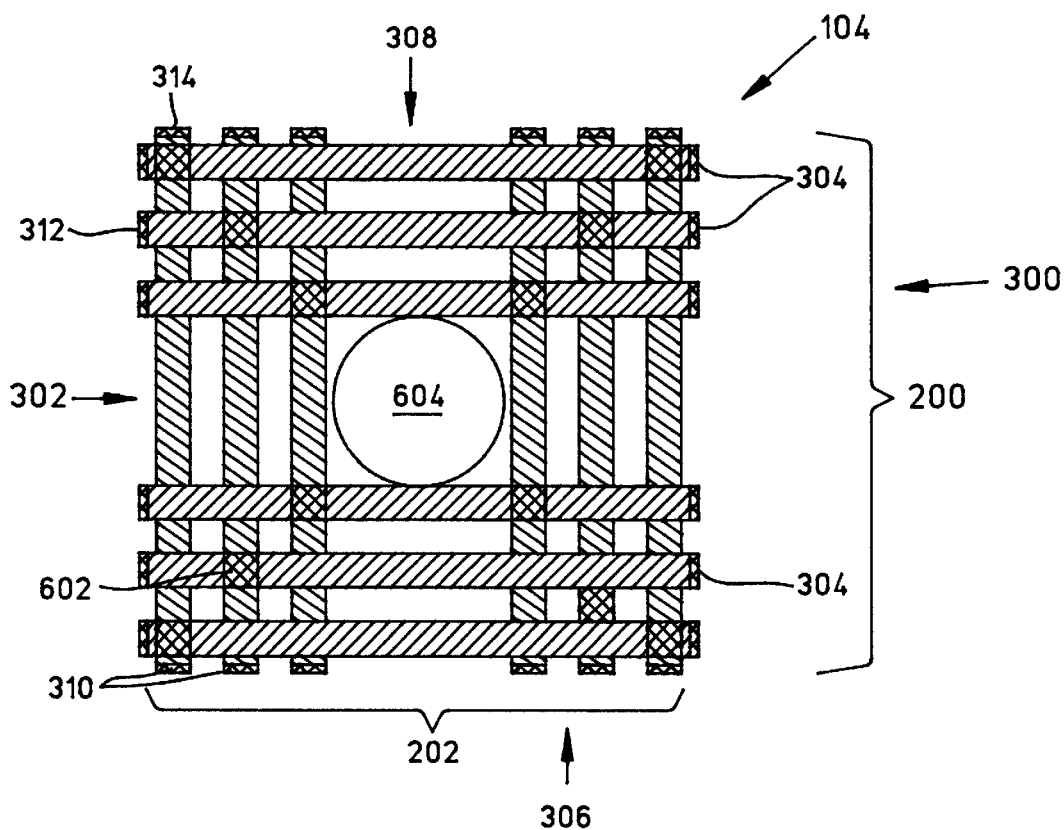
FIG. 3 is a plan view of a single cell illustrating the first and second metal layers.
Figure 3:
Figure 3:

FIG. 3 is a plan view of a single cell illustrating the first metal layer 200 and the second metal layer 202. Each template cell is a rectangle, preferably a square, with a first side 300 and a second side 302, parallel to the first side 300. The first metal layer 200 includes a plurality of parallel bus lines, such as lines 304, extending from the first side 300 to the second side 302 of the template cell 104. For convenience, the first metal layer 200 is represented by horizontal bus lines 304 in FIG. 3.

Likewise, each template cell 104 has a third side 306 adjacent the first side 300 and a fourth side 308 parallel to the third side 306. The second metal layer 202 includes a plurality of parallel bus lines, such as lines 310, extending from the third side 306 to the fourth side 308 of the template cell 104. For convenience, the second metal layer 202 is represented by vertical bus lines 310 in FIG. 3.

The bus lines 304 in the first metal layer 200 have connection areas for connection to bus lines in abutting template cells (not shown, see FIGS. 1 and 2). One such connection area is the double cross-hatched region labeled with reference designator 312. Likewise, the bus lines 310 in the second metal layer 202 have connection areas, such as double cross-hatched area 314, for connecting to bus lines in abutting template cells (not shown). These connection areas 312, 314 are located proximate to the edges of the cell.

Figure 4:
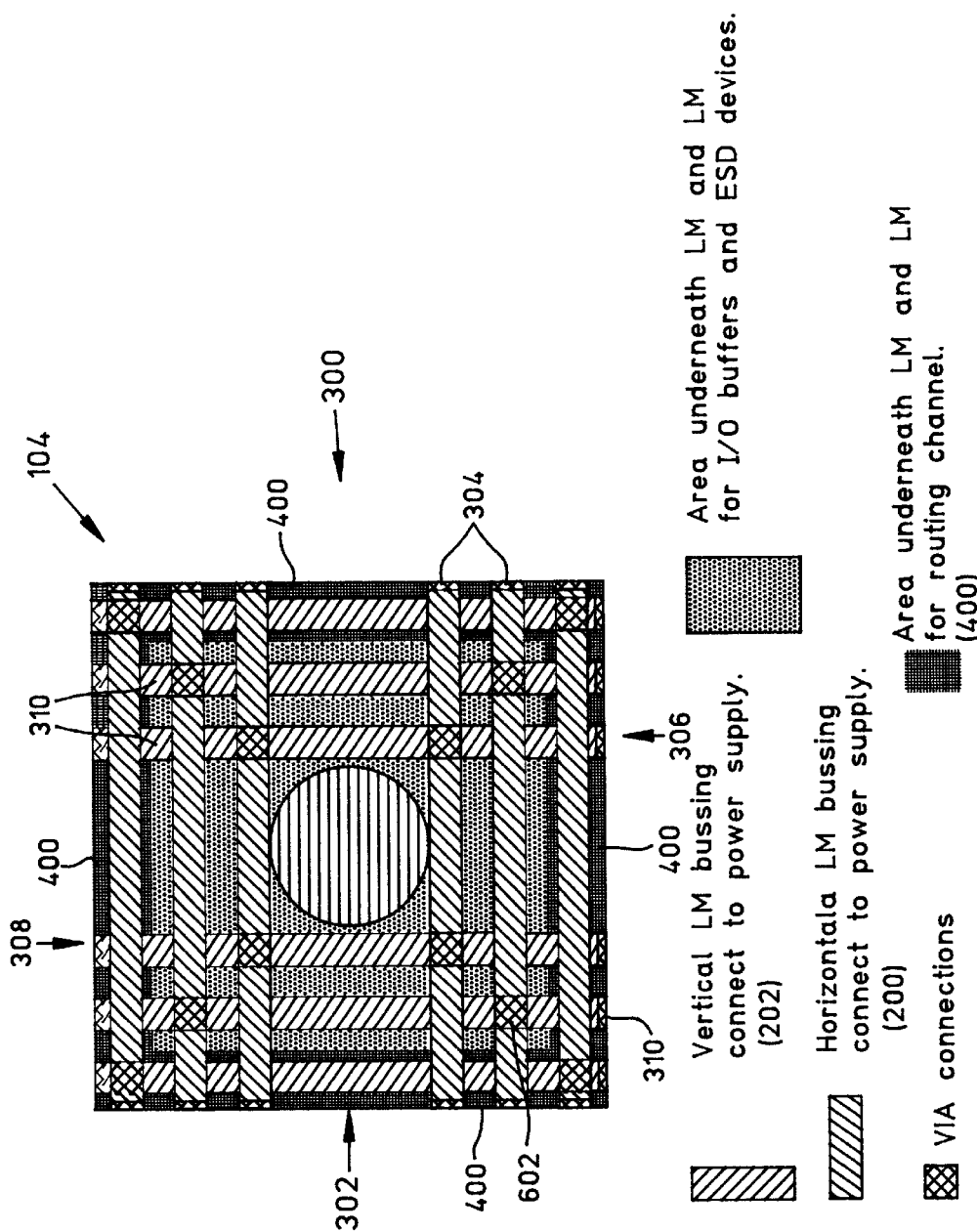
FIG. 4 is a plan view of the single cell of FIG. 3, further illustrating the signal routing area underlying the second metal layer.

FIG. 4 is a plan view of the single cell of FIG. 3, further illustrating the signal routing area underlying the second metal layer. The signal routing layer includes a routing channel 400 adjacent to the first, second, third, and fourth sides.

Figure 5:
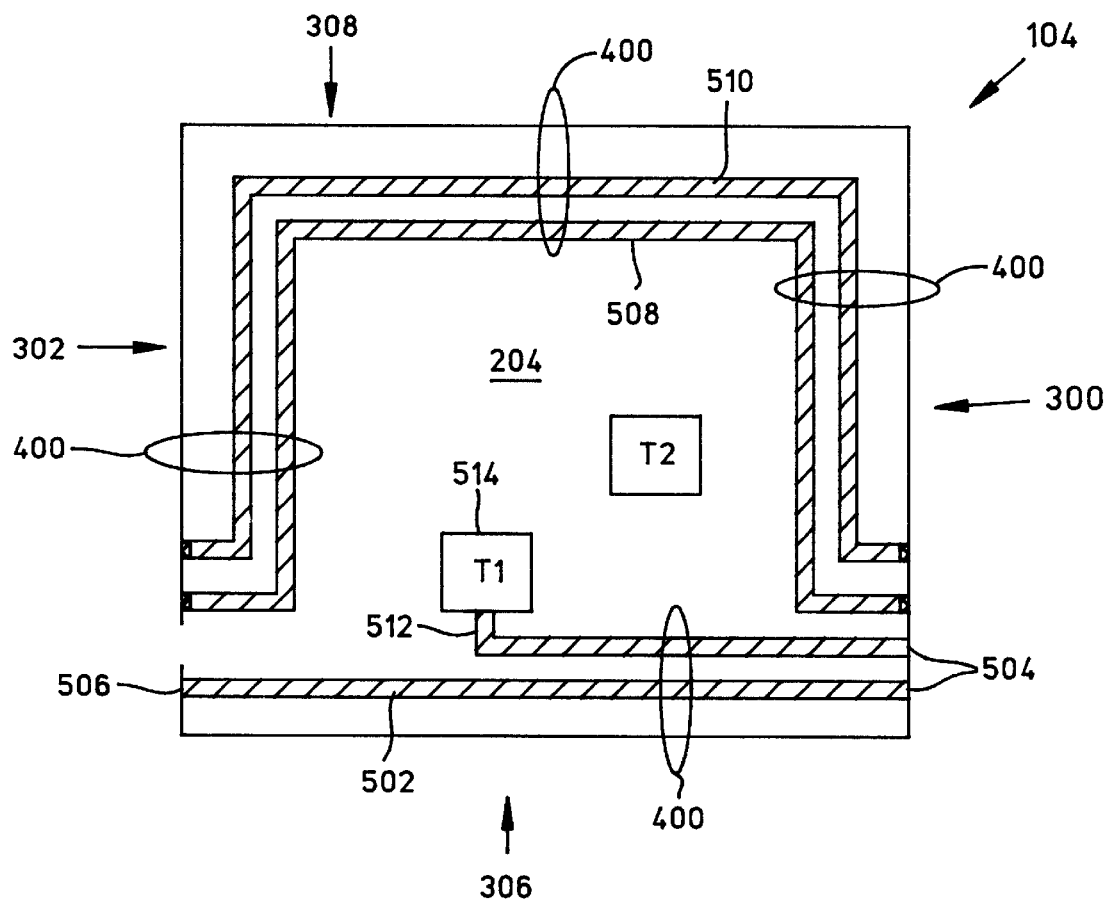
FIG. 5 is a plan view of the single cell of FIG. 4 with the first and second metal layers removed.

FIG. 5 is a plan view of the single cell of FIG. 4 with the first and second metal layers 200/202 removed. Each routing channel 400 of the signal routing layer 204 includes a plurality of signal trace lines. Specifically, a first signal trace 500 and a second signal trace 502 are shown, but the invention is not limited to any particular number of signal trace lines. Signal trace lines may extend from the first side 302 to the second side 300 of the template cell 104. Routing channel signal trace lines 500 and 502 include connection areas 504 and 506 (double cross-hatched areas) for connecting the signal trace lines in abutting template cells (not shown). Signal traces can be routed and connected in a variety of configurations. Although signal traces 508 and 510 are shown unconnected to any feature, they can be connected to features (such as transistors) resident on the signal routing layer. As shown, signal traces 508 and 510 may extend to the edges of the template cell to accommodate connections to a neighboring cell.

Also shown, the signal routing layer 204 includes input/output buffer transistors and/or vias to transistors on IC layers underlying the signal routing layer. As shown, a connecting trace 512 connects signal trace 500 to transistor 514 (T1).

Figure 6:
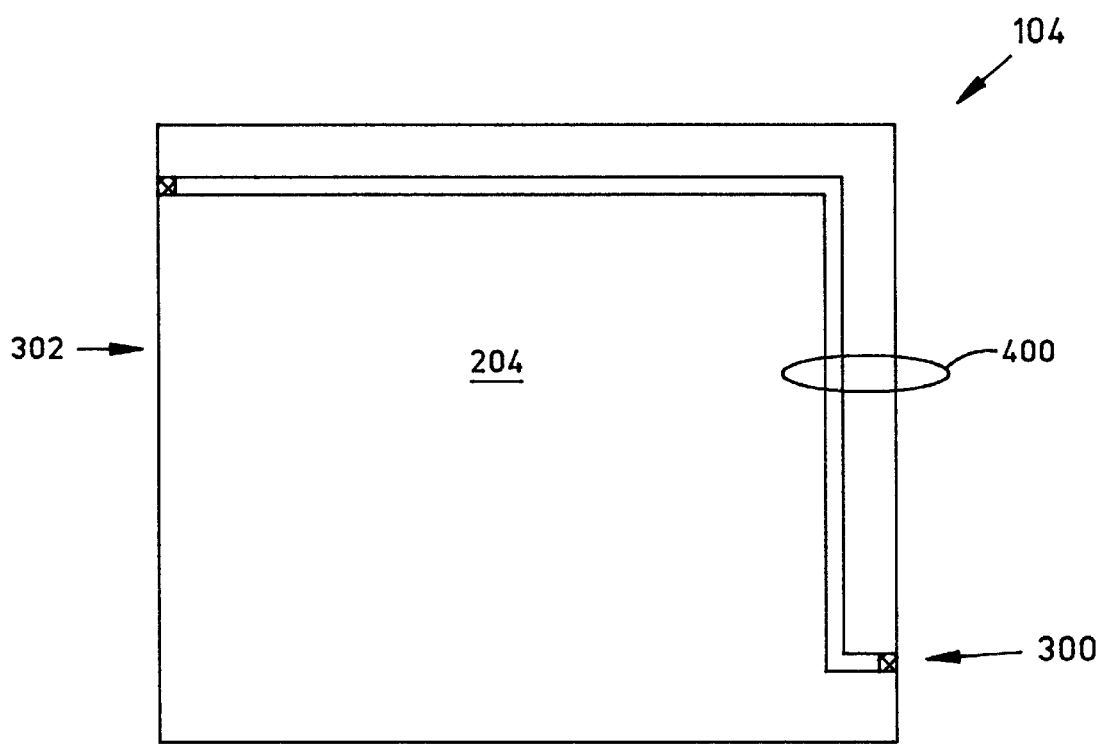
FIG. 6 depicts an alternate example of a routing channel connection on the signal routing layer, between the first side and the second side of the cell.

FIG. 6 depicts an alternate example of a routing channel connection on the signal routing layer 204, between the first side 300 and the second side 302 of the cell 104. Specifically, a signal trace 600 is shown in the routing channel 400.

Returning to FIG. 3, each template cell 104 typically comprises interlevel vias connectable to the first metal layer, the second metal layer, and the routing channel. As is well known, a via is a interlevel connection, typically in the form of a column, that connects different interlevels. As shown, a via 602 (double cross-hatched area) connects a bus line 304 of the first metal layer to a bus line 310 of the second metal layer. Vias could also be formed between either of the metal layers and the signal routing layer, between either of the metal layers and layers of the IC underlying the signal routing layer, or between the signal routing layer and layers of the IC underlying the signal routing layer.

Each template cell 104 typically includes an I/O connection pad 604 for receiving a solder ball overlying the first metal layer 200. The I/O connection pad 604 can be connected through a via directly to an underlying bus line in either the first or second metal layers 200/202. Alternately, the I/O connection pad 604 can be connected through the combination of a via and a connection trace. As is well known in the art, the connection pad 604 can be designed to interface with C4 (controlled collapse chip connection), ball grid array (BGA), chip scale package (CSP) connections, and the like. The general concepts of the invention remain relevant despite the geometry and scale of the pad elements, line elements, and interlevel thicknesses.

Figure 7A:
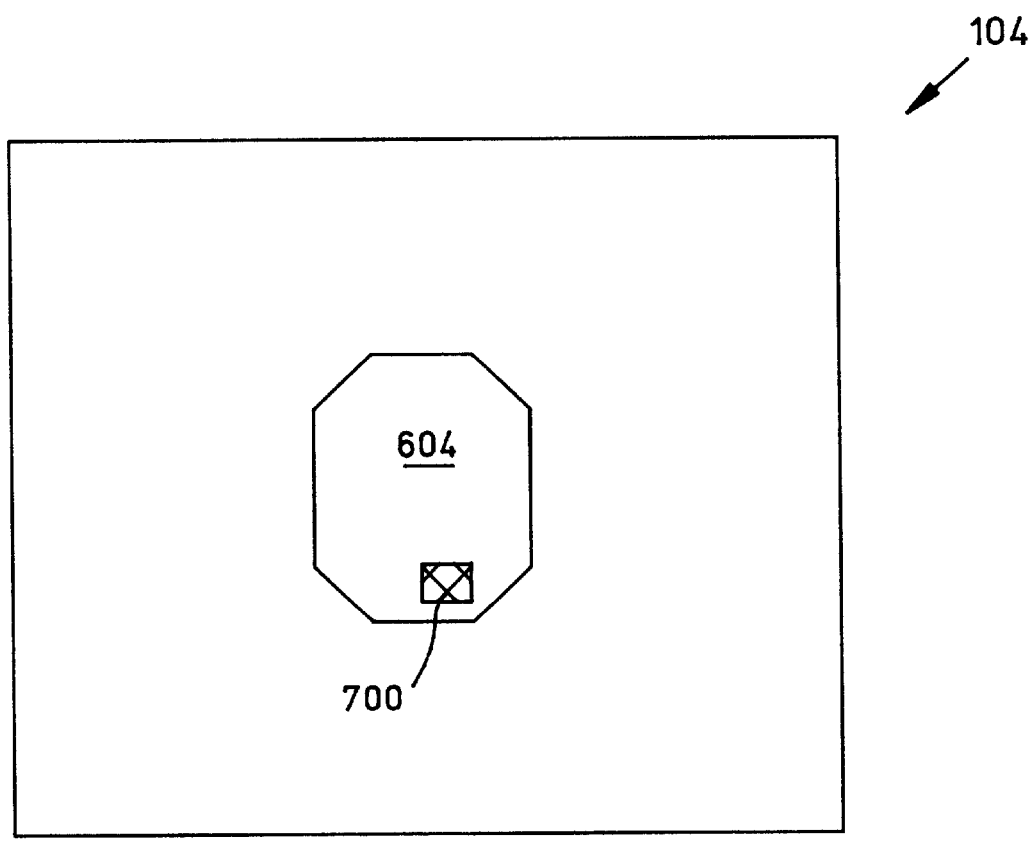
FIGS. 7a and 7b illustrate the connection of the I/O connection pad through a via.
Figure 7B:
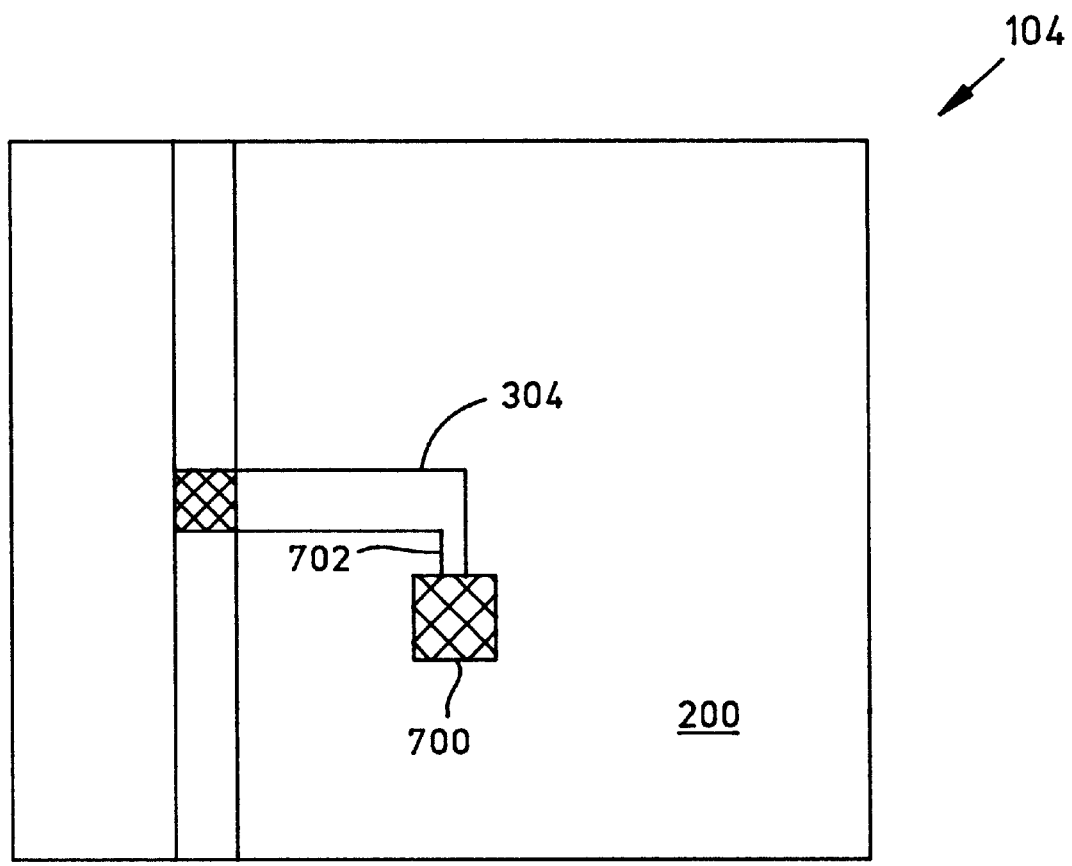

FIGS. 7a and 7b illustrate the connection of the I/O connection pad 604 through a via. In FIG. 7a, the top or end of a via 700 is shown in the I/O connection pad area 604. In FIG. 7b, the via 700 is connected to bus line 304 in first metal layer 200 with a connection trace 702. Via connections (not shown) can be made between the I/O connection pad and a bus line on the second metal layer.

In summarizing FIGS. 1 through 7b, each cell template 104 consists of a two-dimensional busing pattern in first metal layer 200 and second metal layer 202. Horizontal power busing occurs in the first metal layer 200 and vertical power busing occurs in the second metal layer, however, the cells can be rotated in any orientation. A C4 bump, or equivalent solder ball connector is placed on top of the first metal layer 200 and the second metal layer 202, at the middle of the template on pad 604. Although the example embodiments described herein utilize C4 bumps, any type of flip-chip bump technology can be employed.

Each of the first metal layer 200 and the second metal layer 202 is a series of parallel metal lines. Each line connects to a power supply. The width of the line is proportional to the current drawn from the associated power supply, so as to make current density of each bus identical when desired. The first metal layer lines and the second metal layer lines are connected by vias, so that the metal lines on different interlevels can be assigned to the same power supply, shorted together in multiple locations. It should also be noted that several voltage potentials can be carried across a cell, using different bus lines. This busing template, depending on orientation, can be a mirror image of itself, in both the horizontal and vertical axes. This property has implication on floor planning on the overall design. In addition, vias can be placed at the edge of the template, so that connections to neighboring cells can be made by abutment.

Typically, the I/O connection pad 604, or flip-chip bump on top of the first metal layer 200 and the second metal layer 202, is connected to a power supply on a PC board, chip carrier, or the like (not shown). This C4 bump is also shorted to one of the template cell power supply lines. For each of the power supply cells, ESD protection devices such as diodes, resistors, capacitors, and transistors are placed underneath that first metal layer 200 and the second metal layer 202. These devices are not placed in the routing channel 400, which is the area that forms the perimeter of the cell. The routing channel 400 allows flexible routing of signals around the power supply cell.

For an I/O signal cell, the I/O connection pad (or the corresponding C4 bump) is connected to one or more I/O buffer transistors located below the first metal layer 200 and the second metal layer 202. For example, via 700 (see FIG. 7a) can be connected to a buffer transistor rather than a power bus as shown in FIG. 7b.

The transistors and their connections of the I/O buffer associated with signal routing layer 204, as well as associated ESD structures, are placed underneath the first metal layer 200 and the second metal layer 202, congregating at the center so that they are in close proximity to the flip-chip C4 bumps. This placement of ESD structures also provide a low resistance path between the C4 bumps and the devices. These transistors are not placed at the perimeter, where the routing channel 400 is reserved for signal routings. In the case of a differential I/O, two instantiations of the template cell are placed side by side and both of the instantiations share the transistors of the differential I/O buffer. Routing channels, in this case, form the perimeter of the rectangle composed of the two instantiations.

Figure 8:
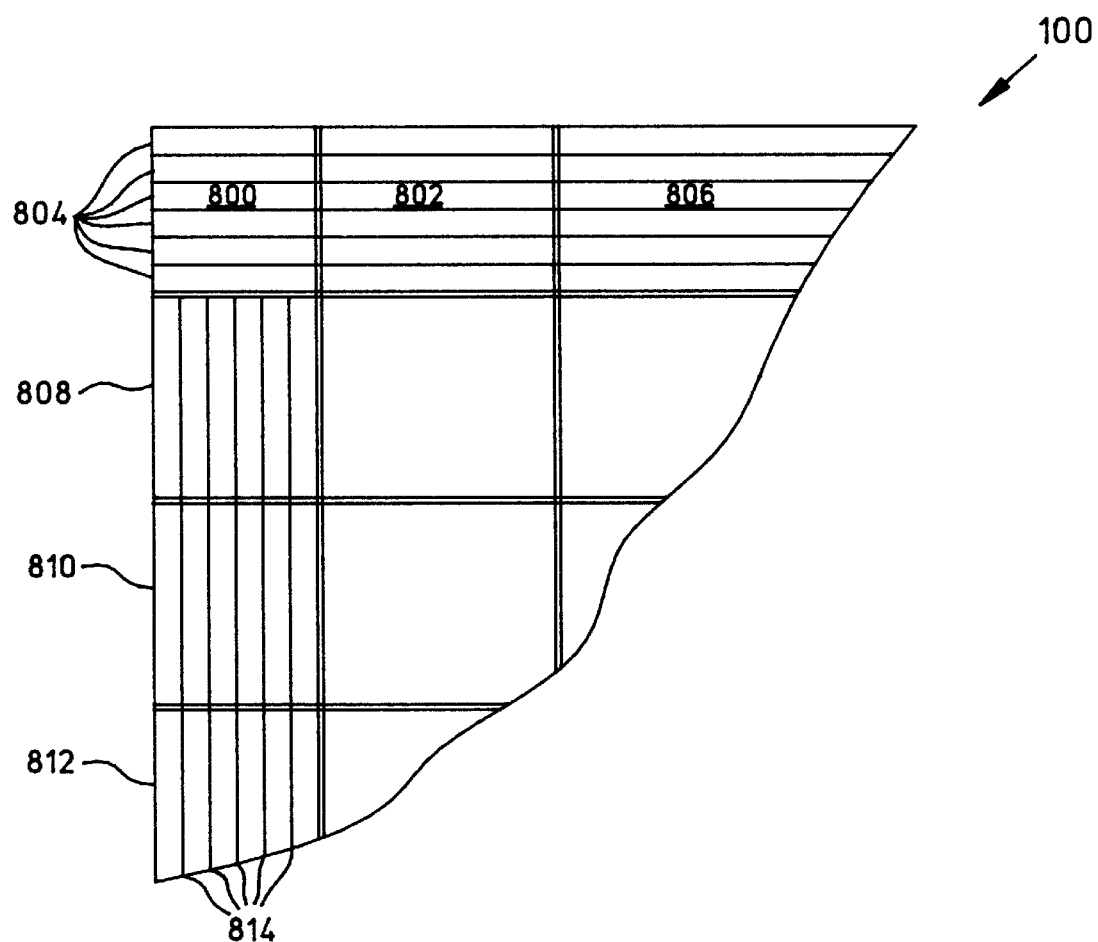
FIG. 8 is a plan diagram of the IC surface illustrating the abutment of cells.

FIG. 8 is a plan diagram of the IC surface 100 illustrating the abutment of cells. It is possible to connect the template cells by abutment. A first cell 800 abuts a second cell 802, and the bus lines 804 extend from the first cell 800 through the second cell 802, through to a third cell 806. With the template mirror image properties, it is possible to rotate the cells in 90, 180, and 270 degrees. As shown, cells 808, 810, and 812 abut and connected bus lines 814 extend across these cells. This template nature of the cells significantly increases the flexibility in placing these I/O and power supply cells. The reservation of cell perimeter as routing channel allows high routability of the floor plan formed with these cells. By reserving area for routing channels, the timing characterization of the I/O buffers are not affected by the routes, such that a cell can be characterized for general usage. In addition, noise coupling between these routing channels and the I/O buffers can also be minimized.

The novel arrangement of power busing allows for flexibility in placement and the routing channel design provides a highly routable layout. The unique placement of ESD structures and I/O buffers makes each cell self-contained for ease of overall floor planning.

Figure 9:
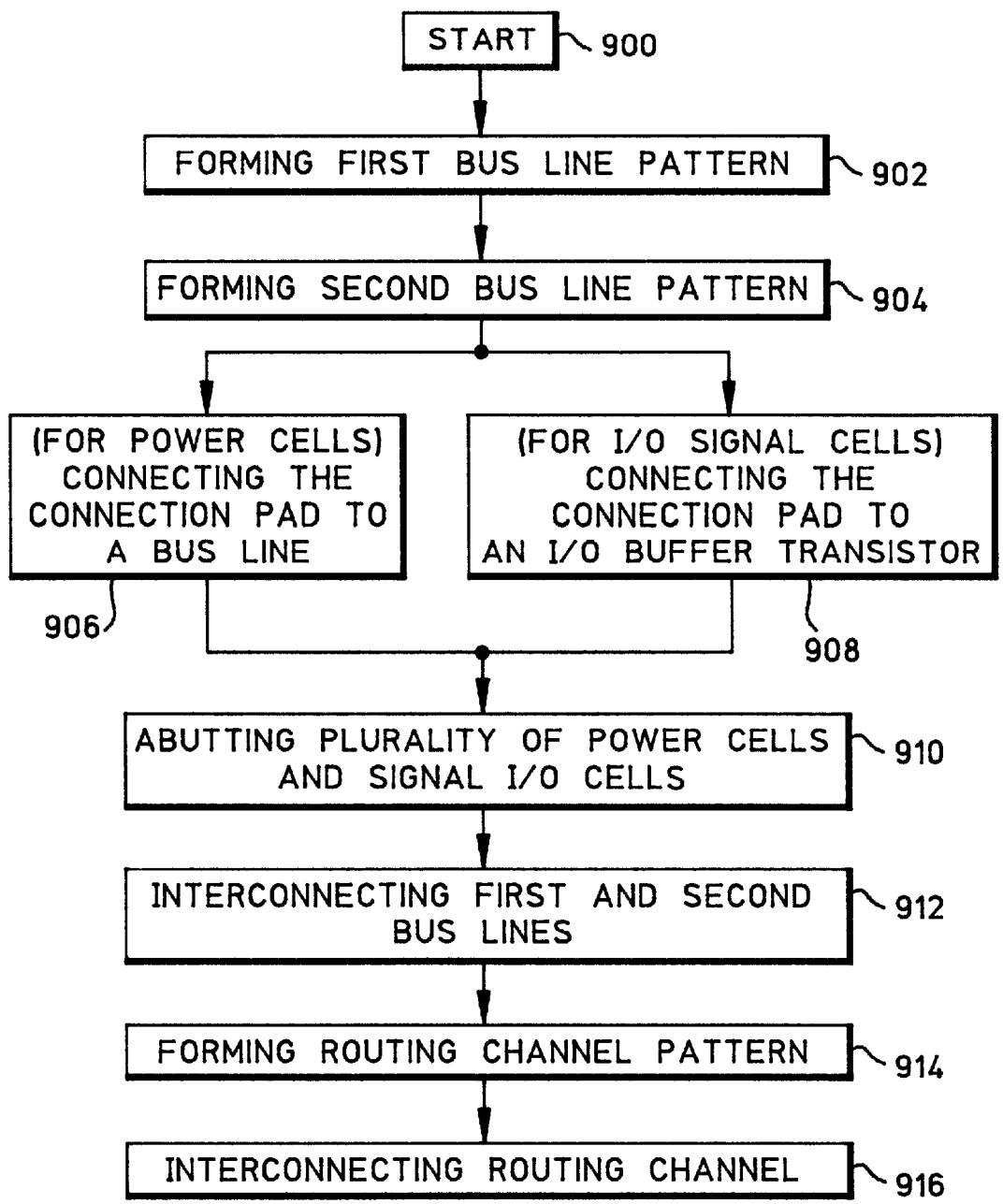
FIG. 9 is a flowchart depicting a method for forming a cell interconnection template in an integrated circuit (IC) having an input/output (I/O) surface with a plurality of cells.

FIG. 9 is a flowchart depicting a method for forming a cell interconnection template in an integrated circuit (IC) having an input/output (I/O) surface with a plurality of cells. Although the method is depicted as a sequence of numbered steps for clarity, no order should be inferred from the numbering unless explicitly stated. The method begins with Step 900. Step 902 forms a first bus line pattern in a plurality of cells. Step 904 forms a second bus line pattern underlying the first bus line pattern in the plurality of cells. Steps 902 and 904 represent the creation or design of the individual cells.

In the context of a power cell, Step 906 connects the connection pad to a bus line using, e.g., a via. In the context of an I/O signal cell, Step 908 connects the connection pad to an I/O buffer transistor using, e.g., a via. In this regard, Steps 906 and 908 represent alternate ways in which the connection pad is connected to a feature in the respective cell. Step 910 abuts the plurality of cells. Step 912 interconnects the first and second bus lines across the plurality of cells in response to abutting the plurality of cells.

Step 914 forms a routing channel pattern underlying the second bus line pattern in the plurality of cells. Step 916, in response to abutting the plurality of cells, interconnects the routing channel across the plurality of cells.

In some aspects of the invention, each cell is a rectangular with a first side, a second side parallel to the first side, a third side adjacent the first and second sides, and a fourth side parallel to the third side. Forming a first bus line pattern in a plurality of cells in Step 902 includes forming a plurality of parallel bus lines extending from the first side to the second side. Forming a second bus line pattern in a plurality of cells in Step 904 includes forming a plurality of parallel bus lines extending from the third side to the fourth side.

In some aspects of the invention, forming a routing channel pattern underlying the second bus line pattern in Step 914 includes forming a routing channel, including a plurality of signal trace lines, adjoining the first, second, third, and fourth sides of the cell.

A system and method have been provided for forming a cell template useful as an IC interface. Specific examples have been given highlighting the distribution of bus lines and a routing channel. However, the template invention is applicable for other circuit elements in a cell, or for other cell purposes. Other variations and embodiments will occur to those skilled in the art.

What is claimed is:

1. A system for forming integrated circuit (IC) interconnections, the system comprising:
   an IC input/output (I/O) surface;
   a plurality of abutted and interconnected template cells on the IC I/O surface; and
   wherein each template cell comprises:
      a first metal layer for busing power;
      a second metal layer, underlying the first metal layer, for busing power; and
      an I/O connection pad overlying the first metal layer for receiving a solder ball.

2. The system of claim 1 wherein each template cell is a rectangle with a first side and a second side, parallel to the first side; and
   wherein the first metal layer includes a plurality of parallel bus lines extending from the first side to the second side of the template cell.

3. The system of claim 2 wherein the plurality of parallel bus lines further include a width for each bus line, the width being proportional to a current drawn from a power supply so as to make current density of each bus line identical.

4. The system of claim 1 wherein each template cell has a third side adjacent the first side and a fourth side parallel to the third side; and
   wherein the second metal layer includes a plurality of parallel bus lines extending from the third side to the fourth side of the template cell.

5. The system of claim 4 wherein the bus lines in the first metal layer have connection areas for connection to bus lines in adjoining template cells.

6. The system of claim 4 wherein the bus lines in the second metal layer have connection areas for connecting to bus lines in adjoining template cells.

7. The system of claim 4 wherein the plurality of parallel bus lines further include a width for each bus line, the width being proportional to a current drawn from a power supply so as to make current density of each bus line identical.

8. The system of claim 1 wherein the I/O connection pad is connected to the first metal layer.

9. The system of claim 1 wherein the I/O connection pad is connected to the second metal layer.

10. The system of claim 1 wherein the I/O connection pad is connected to one or more I/O buffer transistors located below the first metal layer and the second metal layer.

11. The system of claim 1 wherein each template cell further comprises:
    a signal routing layer underlying the second metal layer.

12. The system of claim 11 wherein each template cell further comprises interlevel vias connectable to the first metal layer, the second metal layer, the signal routing layer and the I/O connection pad.

13. The system of claim 11 wherein the signal routing layer may include one or more diodes, resistors, capacitors or transistors.

14. The system of claim 13 wherein the one or more diodes, resistors, capacitors or transistors are located near the center of the signal routing layer.

15. A system for forming integrated circuit (IC) interconnections, the system comprising:
    an IC input/output (I/O) surface;
    a plurality of abutted and interconnected rectangular template cells on the IC I/O surface; and
    wherein each template cell comprises:
       a first side, a second side parallel to the first side, a third side adjacent the first and second sides, and a fourth side parallel to the second side;

a first metal layer including a plurality of parallel bus lines extending from the first side to the second side with connection areas for connection to bus lines in adjoining template cells;

a second metal layer, underlying the first metal layer, including a plurality of parallel bus lines extending from the third side to the fourth side with connection areas for connection to bus lines in adjacent template cells; and an I/O connection pad overlying the first metal layer for receiving a solder ball.

16. The system of claim 15 wherein each template cell further comprises:

a signal routing layer underlying the second metal layer, having a routing channel adjacent to the first, second, third, and fourth sides.

17. The system of claim 16 wherein each routing channel includes a plurality of signal trace lines.

18. The system of claim 17 wherein the routing channel signal trace lines include connection areas for connecting the signal trace lines in adjoining template cells.

19. The system of claim 18 wherein each template cell further comprises interlevel vias connectable to the first metal layer, the second metal layer, and the routing channel.

20. The system of claim 16 wherein the signal routing layer includes at least one I/O buffer transistor and a connection trace for connecting the buffer transistor to a routing channel signal trace.

21. The system of claim 15 wherein the template cell includes a via from the solder pad to the first metal layer; and wherein the first metal layer includes a connection trace to connect a bus line in the first metal layer to the via.

22. The system of claim 15 wherein the template cell includes a via from the solder pad to the second metal layer; and the second metal layer includes a connection trace to connect a bus line in the second metal layer to the via.

23. The system of claim 15 wherein the plurality of parallel bus lines further include a width for each bus line, the width being proportional to a current drawn from a power supply so as to make current density of each bus line identical.

24. An integrated circuit (IC) template cell comprising:

a first metal layer with power bus lines having connection areas for connecting to abutting template cell bus lines;

a second metal layer underlying the first metal layer with power bus lines having connection areas for connecting to abutting template cell bus lines; and an I/O connection pad overlying the first metal layer for receiving a solder ball.

25. The template cell of claim 24 in which the template cell is a rectangle with four sides, the template cell further comprising:

a routing channel layer underlying the second metal layer having a routing channel adjacent the first, second, third, and fourth sides with connection areas for connecting to abutting template cell routing channels.

26. The template cell of claim 25 wherein the routing channel layer includes a plurality of input/output (I/O) buffer transistors interior in the cell from the routing channel.

27. The template cell of claim 26 wherein the I/O connection pad is connected to the I/O buffer transistors.

28. The template cell of claim 25 wherein each template cell further comprises interlevel vias connectable to the first metal layer, the second metal layer, the routing channel layer and the I/O connection pad.

29. The template cell of claim 25 wherein the routing channel layer includes one or more diodes, resistors, capacitors or transistors interior in the cell from the routing channel.

30. The template cell of claim 24 wherein the power bus lines further include a width for each bus line, the width being proportional to a current drawn from a power supply so as to make current density of each bus line identical.

31. The template cell of claim 24 wherein the I/O connection pad is connected to one or more of the power bus lines of the first metal layer.

32. The template cell of claim 24 wherein the I/O connection pad is connected to one or more of the power bus lines of the second metal layer.

* * * * *